US010305256B2

(12) United States Patent
Paoletti et al.

(10) Patent No.: US 10,305,256 B2
(45) Date of Patent: May 28, 2019

(54) SEMICONDUCTOR LASER DIODE AND METHOD OF MANUFACTURE THEREOF

(71) Applicant: PRIMA ELECTRO S.P.A., Moncalieri (TO) (IT)

(72) Inventors: Roberto Paoletti, Airasca (IT); Claudio Coriasso, Leini (IT); Paolo Calefati, Turin (IT)

(73) Assignee: Prima Electro S.P.A., Moncarlieri (TO) (IT)

( * ) Notice: Subject to any disclaimer, the term of this patent is extended or adjusted under 35 U.S.C. 154(b) by 0 days.

(21) Appl. No.: 15/439,713

(22) Filed: Feb. 22, 2017

(65) Prior Publication Data

US 2017/0244221 A1    Aug. 24, 2017

(30) Foreign Application Priority Data

Feb. 23, 2016 (IT) .......................... 102016000018622

(51) Int. Cl.
*H01S 5/12* (2006.01)
*H01S 5/34* (2006.01)
(Continued)

(52) U.S. Cl.
CPC .............. *H01S 5/34* (2013.01); *H01S 5/0206* (2013.01); *H01S 5/028* (2013.01); *H01S 5/125* (2013.01); *H01S 5/1231* (2013.01)

(58) Field of Classification Search
CPC .......... H01S 5/0206; H01S 5/125; H01S 5/34; H01S 5/1231
(Continued)

(56) References Cited

U.S. PATENT DOCUMENTS

2001/0043384 A1* 11/2001 Ishizaka ................... H01S 5/12
                                                        359/248
2003/0063645 A1*  4/2003 Yoshida ................ H01S 5/1082
                                                        372/49.01
(Continued)

FOREIGN PATENT DOCUMENTS

EP          0 966 077 A2     12/1999
EP          0966077       *  12/1999  ............. H01S 3/085
(Continued)

OTHER PUBLICATIONS

C. Marinelli et al., *Threshold Current Reduction in InGaN MQW Laser Diode with λ /4 air/ Semiconductor Bragg Reflectors*, Electronic Letters, vol. 36, No. 20, Sep. 28, 2000, 2 pp.
(Continued)

*Primary Examiner* — Tuan N Nguyen
(74) *Attorney, Agent, or Firm* — Workman Nydegger

(57) ABSTRACT

A laser-diode device includes a substrate; at least one first cladding layer placed on the substrate; an active layer placed on the first cladding layer and arranged to emit a radiation; at least one second cladding layer placed on the active layer, said cladding layers being adapted to form a heterojunction; a first terminal facet and a second terminal facet placed transversally relative to the cladding layers and to the active layer; a periodic structure, placed in proximity to the second terminal facet and within the second cladding layer, and belonging to an optical cavity, wherein the first terminal facet represents the output mirror from which the radiation generated by the active layer exits, and the second terminal facet, integrated by the periodic structure, represents a second mirror having high reflectivity, so that the radiation produced by the active layer exits almost totally through the first mirror.

10 Claims, 1 Drawing Sheet

(51) Int. Cl.
*H01S 5/028* (2006.01)
*H01S 5/125* (2006.01)
*H01S 5/02* (2006.01)

(58) Field of Classification Search
USPC ............... 438/22; 372/46.01, 50.11, 50.124; 359/428
See application file for complete search history.

(56) References Cited

U.S. PATENT DOCUMENTS

| | | | | |
|---|---|---|---|---|
| 2003/0091300 | A1* | 5/2003 | Irino | G02B 6/124 385/88 |
| 2008/0089377 | A1* | 4/2008 | Fukuda | H01S 5/028 372/49.01 |
| 2010/0290489 | A1* | 11/2010 | Agresti | H01S 5/0265 372/26 |
| 2010/0291717 | A1* | 11/2010 | Lee-Bouhours | B82Y 20/00 438/31 |
| 2011/0032967 | A1* | 2/2011 | Behfar | B82Y 20/00 372/45.01 |
| 2011/0228805 | A1* | 9/2011 | Trankle | H01S 5/026 372/50.11 |
| 2011/0235667 | A1* | 9/2011 | Fukuda | H01S 5/026 372/50.11 |
| 2013/0308178 | A1* | 11/2013 | Matsui | H01S 5/34 359/344 |
| 2015/0092800 | A1* | 4/2015 | Zucker | H01S 5/0265 372/29.015 |

FOREIGN PATENT DOCUMENTS

| | | | | |
|---|---|---|---|---|
| WO | | 02/41456 A2 | 5/2002 | |
| WO | WO 02-41456 | * | 5/2002 | ............... H01S 3/00 |

OTHER PUBLICATIONS

Italian Search Report dated Oct. 17, 2016, issued in Italian Application No. IT UB20160994, dated Feb. 22, 2016.

* cited by examiner

SEMICONDUCTOR LASER DIODE AND METHOD OF MANUFACTURE THEREOF

CROSS-REFERENCE TO RELATED APPLICATIONS

The present application claims priority to Italian Application No. 102016000018622 (UB2016A000994), filed Feb. 23, 2016, which is incorporated herein by specific reference.

BACKGROUND OF THE INVENTION

1. The Field of the Invention

The present invention relates to a light source, in particular a semiconductor laser diode, as well as to a method of manufacture thereof.

2. The Relevant Technology

A laser diode is a semiconductor diode, the active material of which, consisting of a p-i-n heterojunction, allows obtaining optical gain within a wavelength range determined by the epitaxial structure of the alloys of semiconductor materials it is composed of, and such heterojunction (optical medium) is inserted in a cavity that is resonant for the optical field.

The population inversion necessary for laser emission is obtained by injection of current into the junction itself. The terminal facets in a laser diode chip can be used for forming the resonant cavity (called laser cavity); an external mirror and/or a Bragg reflector may also be used for this purpose.

Laser diodes are extremely efficient sources of coherent light with high density of power and brilliance, and are widely used in opto-electronic devices.

The power emitted by semiconductor diodes may vary from a few tens or hundreds of milliwatt (information transmission applications) to values in excess of ten Watt (high-power diodes).

In order to obtain higher power ratings, e.g., for direct material processing applications, the space multiplexing technique is normally employed: the beams of the single laser diodes are simply overlapped in a well-defined spatial region. However, in such a way, the quality of the emitted beam (analytically defined by a known parameter called BPP, Beam Parameter Product) generated by such multiplexing is degraded in comparison with the quality of the original beams, because the size of the beam is increased.

Such degradation prevents the use of laser diodes organized in such a configuration for most material processing applications.

On the other hand, it is possible to sum up the power of the single beams without jeopardizing the quality of the final beam thus obtained, provided that the starting beams differ in some properties, e.g., polarization or wavelength. The latter case (referred to as spectral or wavelength multiplexing) is particularly interesting, in that it is possible to sum up N devices, the wavelength of which is defined as $\lambda 1 \square \lambda N$, in order to obtain a beam having the same qualities as the original optical beam, but N times more powerful.

Therefore, in order to allow direct use of high-power laser diodes for material processing applications without requiring a fiber or gas laser as a high-quality beam source, it is necessary to employ lasers having a narrow emission spectrum and a very stable emission. These aspects are crucial for being able to sum up the powers emitted by an array of laser diodes via wavelength multiplexing, while keeping the quality of the beam of each diode unaltered.

The technique which is most commonly used in order to stabilize the emission wavelength requires the use of external volumetric stabilizers (Bragg gratings on crystals or thin films).

One example is shown in document U.S. Pat. No. 9,209,605, which describes a laser diode wherein dichroic reflectors are arranged sequentially one after the other so as to form an array, and wherein each reflector has a sequential array index. Individual reflectors of the array re-direct sub-beams coming from individual laser emitters having the same array indices to propagate them through the dichroic reflectors having higher array indices, so as to form a combined optical beam.

That part of the optical power which is back-reflected by the dichroic reflectors serves the very purpose of stabilizing the emission of each laser diode.

Such an approach offers the advantage of allowing the use of Fabry-Perot laser diodes, which are relatively simple from a technological viewpoint, without any kind of stabilization integrated in the chip itself. However, this configuration requires a more complex and expensive module layout, because suitable reflectors need to be inserted in order to stabilize the emission (which would otherwise be as wide as several tens of nanometer, as well as extremely sensitive to the temperature and polarization current of the lasers themselves).

Moreover, the stability of the back-reflection of the mirror, which is necessary to obtain a stabilized emission without introducing high losses that would be critical for power modules, imposes very stringent requirements as regards the mechanical characteristics of the module itself and the optical characteristics of the focusing systems, resulting in high production costs poorly scalable in volume productions.

Document "10 W-reliable 90 μm-wide broad area lasers with internal grating stabilization", P. Crump*, J. Fricke, C. M. Schultz, H. Wenzel, S. Knigge, O. Brox, A. MaaSdorf, F. Bugge, G. Erbert describes the manufacture of power laser diodes with a narrow spectral emission that is stable as temperature changes. In a first example, grating surfaces are made by etching in order to form the rear reflector as a distributed Bragg grating (DBR). In this way, the rear facet is replaced with a wavelength-selective mirror, thereby obtaining a stable and narrow emission.

In a second example, the grating is inserted into the semiconductor by using etching and growth techniques in order to form distributed DFB lasers, wherein the rear facet has a high-reflectivity coating and the DFB operates as a low-reflectivity coupler. This latter solution, which is simpler in terms of grating construction, offers however lower power output and wavelength stabilization.

Document "High-Brilliance Diode Lasers with Monolithically-Integrated Surface Gratings as Sources for Spectral Beam Combining", J. Fricke*, P. Crump, J. Decker, H. Wenzel, A. MaaSdorf, G. Erbert, G. Trankle describes an example of application of the above-described wavelength stabilization techniques for obtaining increased power with constantly good beam quality by means of a spectral combination. Stabilization of the wavelengths of the single emitters is achieved by monolithic integration of a Bragg grating in the chip.

With the exception of the integration of the Bragg mirror, the above-described solutions are still traditional as far as the other technological steps are concerned, since the laser cavity must still be created by cleavage (fracturing along the crystallographic axis) of the process wafer, and the laser diodes thus obtained still need suitable depositions of dielectric material on their facets (typically at bar level) for the dual purpose of passivating and preserving the facet itself and modify (towards the upward-reflected or downward-reflected, according to the case) the natural reflectivity at the semiconductor-air interface.

SUMMARY OF THE INVENTION

It is therefore one object of the present invention to propose a laser-diode device which allows obtaining a laser diode with sufficiently narrow spectral emission allowing overlapping with other beams having a different wavelength, so as to provide a combined beam having a low (good) BPP without increased size.

It is a further object of the present invention to provide a method for obtaining a highly efficient, easy-to-manufacture, low-cost laser diode suitable for volume production.

Some embodiments of the present invention concern a laserdiode device and a method of manufacture thereof which can overcome the drawbacks of the prior art.

In one embodiment, the laser diode device comprises a substrate, at least one first cladding layer placed on the substrate, an active layer placed on the first cladding layer and arranged to emit a radiation, at least one second cladding layer placed on the active layer, the cladding layers being adapted to form a heterojunction, thereby allowing an efficient injection of current into the active layer and the optical confinement. The device further comprises a first terminal facet and a second terminal facet placed transversally relative to the cladding layers and to the active layer, and formed within said layers by means of dry or wet etchings and/or combinations thereof. The device comprises also a periodic structure placed in proximity to the second terminal facet and within the second cladding layer, and belonging to an optical cavity, wherein the first terminal facet represents the output mirror from which the radiation generated by the active layer exits, and the second terminal facet, integrated by the periodic structure, represents a second mirror having high reflectivity, so that the radiation produced by the active layer exits almost totally through the first mirror.

In another embodiment, the periodic structure comprises the active zone and the first cladding layer.

In another embodiment, the substrate comprises gallium arsenide or other substrates.

In another embodiment, the active layer is a quantum well structure arranged to generate optical gain across a broad wavelength spectrum.

In another embodiment, the cladding layers are layers of semiconductor material including gallium arsenide, aluminium gallium arsenide, or combinations thereof, on a substrate of gallium arsenide.

In another embodiment, the periodic structure is a Bragg grating.

In another embodiment, the diode further comprises metallic layers respectively placed on the second cladding layer and under the substrate, which are arranged to form an ohmic contact of the diode.

In another embodiment, the terminal facets are coated with a passivation layer arranged to act as an anti-reflection layer, thus reducing the residual reflectivity at the semiconductor/air interface.

In another embodiment, a method for obtaining a laser diode comprising:

a substrate, at least one first cladding layer placed on the substrate, an active layer placed on the first cladding layer and arranged to emit a radiation, at least one second cladding layer placed on the active layer, the cladding layers being adapted to form a heterojunction, thereby allowing an efficient injection of current into the active layer and the optical confinement, a first terminal facet and a second terminal facet placed transversally relative to the cladding layers and to the active layer, and formed within said layers by means of dry or wet etchings and/or combinations thereof, a periodic structure placed in proximity to the second terminal facet and within the second cladding layer, and belonging to an optical cavity, wherein the first terminal facet represents the output mirror from which the radiation generated by the active layer exits, and the second terminal facet, integrated by the periodic structure, represents a second mirror having high reflectivity, so that the radiation produced by the active layer exits almost totally through the first mirror;

comprises the progressive steps of:

depositing a first cladding layer on a substrate, depositing an active layer on the first cladding layer, depositing a second cladding layer on the active layer, performing a first etching step on the layers deposited on the substrate, so as to obtain two terminal facets arranged transversally to said layers, performing a second etching step on the second cladding layer in proximity to one of the two terminal facets according to a predefined pattern, so as to obtain a periodic structure within the second cladding layer.

In another embodiment, a method for obtaining a laser diode comprising:

a substrate, at least one first cladding layer placed on the substrate, an active layer placed on the first cladding layer and arranged to emit a radiation, at least one second cladding layer placed on the active layer, the cladding layers being adapted to form a heterojunction, thereby allowing an efficient injection of current into the active layer and the optical confinement, a first terminal facet and a second terminal facet placed transversally relative to the cladding layers and to the active layer, and formed within said layers by means of dry or wet etchings and/or combinations thereof, a periodic structure placed in proximity to the second terminal facet and within the second cladding layer, and belonging to an optical cavity, wherein the first terminal facet represents the output mirror from which the radiation generated by the active layer exits, and the second terminal facet, integrated by the periodic structure, represents a second mirror having high reflectivity, so that the radiation produced by the active layer exits almost totally through the first mirror;

comprises the progressive steps of:

depositing a first cladding layer on a substrate; depositing an active layer on the first cladding layer; depositing a second cladding layer on the active layer; performing a first etching step on the second cladding layer in proximity to one of the two terminal facets according to a predefined pattern, so as to obtain a periodic structure within the second cladding layer; performing a second etching step on the layers deposited on the substrate, so as to obtain two terminal facets arranged transversally to said layers.

BRIEF DESCRIPTION OF THE DRAWINGS

Further features and advantages of the invention will become apparent in the light of the following detailed description, provided by way of non-limiting example with reference to the annexed drawings, wherein.

DETAILED DESCRIPTION OF THE PREFERRED EMBODIMENTS

In brief, the laser diode according to the present invention integrates a Bragg reflector mirror in order to stabilize the wavelength emitted by the diode itself, includes facets of the cavity of the laser diode directly obtained by semiconductor etching, and allows obtaining efficient wavelength multiplexing, particularly for direct diode material processing applications.

Figure 1:
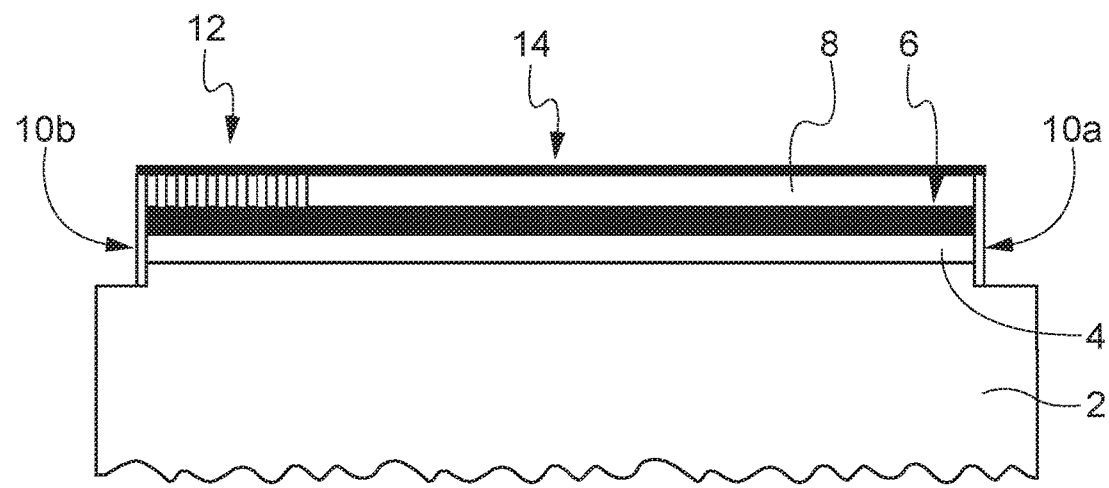
FIG. 1 is a sectional view of a laser-diode device according to the present invention.

FIG. 1 shows a sectional view of a diode 1 according to the present invention. It comprises a substrate 2, e.g., a GaAs (gallium arsenide) substrate or the like, whereon a first cladding layer 4 (or a plurality of cladding layers), an active layer 6, and a second cladding layer 8 (or a plurality of cladding layers) are progressively deposited through the use of deposition techniques known to those skilled in the art.

The active layer 6 is preferably a quantum well structure arranged to generate an optical gain across a broad wavelength range. The cladding layers 4 and 8 are layers of semiconductor material, e.g., GaAs, AlGaAs or combinations thereof on a GaAs substrate, which incorporate the quantum well structure and which are arranged to form a heterojunction (following p or n doping, which is per se known to those skilled in the art), thereby allowing an efficient injection of current into the quantum well structure and the optical confinement.

The cladding layers 4 and 8 and the active layer 6 are subjected, in a per se known manner, to an etching process, preferably a dry etching process such as RIE (Reactive Ion etching) or chemical etching, so as to obtain two terminal facets 10a and 10b. The terminal facets 10a and 10b are thus created within the cladding layers 4,8 and the active layer 6, and are arranged transversally relative to a longitudinal axis of extension of such layers.

The first terminal facet 10a represents the output mirror from which the radiation generated by the active layer 6 exits. A periodic structure 12, preferably a Bragg grating, is formed in proximity to the other terminal facet 10b, within the second cladding layer 8, via known etching techniques, thereby obtaining a second mirror having high reflectivity.

The radiation produced by the active layer 6 will thus exit almost totally through the first mirror 10a.

The wavelength of the output beam is related, in a per se known manner, to the pitch of the grating of the periodic structure 12.

On the upper cladding layer 8 and under the substrate 2, respective metallic layers 14 are deposited by sputtering or by using evaporation techniques, which are arranged to form an ohmic contact of the diode 1.

The terminal facets 10a and 10b are coated with at least one passivation layer 16, deposited at the level of the substrate 2, without requiring any further cleavage processes, by using evaporation or CVD techniques. The at least one passivation layer 16 also acts as an anti-reflection layer, thus reducing the residual reflectivity at the semiconductor/air interface, which adversely affects the spectral properties of the periodic structure.

Therefore, a method for obtaining a diode 1 according to FIG. 1 comprises the progressive steps of:

a) depositing a first cladding layer 4 on a substrate 2;
b) depositing an active layer 6 on the first cladding layer 4;
c) depositing a second cladding layer 8 on the active layer 6;
d) performing a first etching step on the layers deposited on the substrate 2, i.e., the cladding layers 4 and 8 and the active layer 6, so as to obtain two terminal facets 10a and 10b;
e) performing a second etching step on the second cladding layer 8 in proximity to one of the two terminal facets 10a or 10b according to a predefined pattern, so as to obtain a periodic structure 12 within said second cladding layer 8.

Alternatively, the second etching step is carried out before the step of forming the terminal facets 10a and 10b.

The peculiar features of this embodiment can be summarized as follows.

1) The use of etching technology for obtaining the terminal facets 10a and 10b permits the creation of mirrors without requiring the use of the traditional wafer fracturing technique, resulting in shorter production and testing times and a more efficient production process.

Furthermore, the integration of the periodic structure 12 into the diode 1 allows obtaining an unbalanced emission of optical power between the first terminal facet 10a and the second terminal facet 10b (so that most of the radiation will exit through the first mirror 10a only) without requiring different depositions between the two facets. In fact, a deposition at the level of the substrate 2 (wafer level), though extremely effective in terms of reduction of processing time, would make it necessary to deposit the same layer on both facets, and would not therefore be suitable for obtaining powers unbalanced towards the output face.

In other words, the integration of the Bragg reflector into the diode 1 also allows, in addition to stabilizing the emission thereof, unbalancing the powers towards the first facet 10a (output facet) in etched-facet structures by using a single and simple deposition for passivation/residual activity reduction.

2) The diode 1 has a narrow emission spectrum (in comparison with the emission of traditional Fabry-Perot lasers), because only those cavity modes having a wavelength within the reflectivity range of the periodic structure 12 participate in the laser emission of the device 1.

3) The diode 1 has a stable emitted-power wavelength because the periodic structure 12 reduces the wavelength shift by at least four times as a function of the temperature. Besides, no external dichroic reflectors or Bragg gratings are necessary for stabilizing the emitted wavelength.

Figure 2:
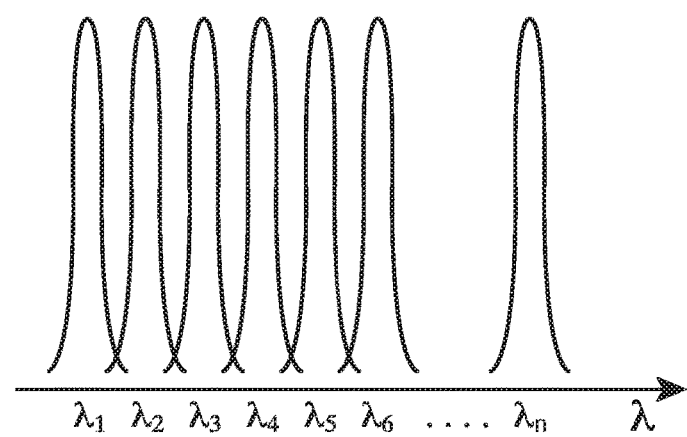
FIG. 2 shows a graph of the overlapping spectra of a plurality of laser diodes according to FIG. 1.

4) Due to the fact that the emission spectrum is very narrow and stable, the output beam of a device can be combined with other beams of other devices at different wavelengths in order to increase the power output in a multi-emitted configuration (see FIG. 2, which shows the phases and different wavelengths emitted by a plurality of diodes) without affecting the BPP of the common output beam. It is therefore possible to overlap, in a same spatial region, different beams emitted by respective devices, so as to obtain a single output beam formed by overlapping said single beams, wherein the output beam maintains a low BPP value.

5) The laser diode according to the present invention allows the output spectrum to be effectively made narrower and more stable without requiring the use of expensive or hardly feasible solutions of external-cavity mirrors. In fact, the technological process in use is carried out directly on the semiconductor substrate. This solution ensures high performance, high yield and low costs, thus allowing high volume production of such high-power laser diodes.

Of course, without prejudice to the principle of the invention, the embodiments and the implementation details may be extensively varied from those described and illustrated herein by way of non-limiting example, without however departing from the protection scope of the present invention as set out in the appended claims.

What is claimed is:

1. A laser-diode device comprising:
   a substrate;
   at least one first cladding layer placed on the substrate;
   an active layer placed on the first cladding layer and arranged to emit a radiation;
   at least one second cladding layer placed on the active layer, said cladding layers being adapted to form a heterojunction, thereby allowing an efficient injection of current into the active layer and an optical confinement transversal to the heterojunction;
   wherein an optical cavity is bounded between a first terminal facet and a second terminal facet, the first terminal facet and the second terminal facet being placed transversally relative to the cladding layers, the active layer, and a portion of the substrate so that the first terminal facet and the second terminal facet pass entirely through the at least one second cladding layer, the active layer, and the at least one first cladding layer but only pass through a portion of the substrate;
   a periodic structure, placed in proximity to the second terminal facet, and belonging to the optical cavity, wherein the first terminal facet represents an output mirror from which radiation generated by the active layer exits, and the second terminal facet, integrated by the periodic structure, represents a second mirror having high reflectivity, so that the radiation produced by the active layer exits almost totally through the first mirror,
   wherein said periodic structure is only within the second cladding layer,
   wherein the cladding layers are layers of semiconductor material including gallium arsenide, aluminium gallium arsenide, or combinations thereof, and the substrate comprises gallium arsenide.

2. The laser-diode device according to claim 1, wherein the substrate comprises gallium arsenide or other substrates.

3. The laser-diode device according to claim 1, wherein the active layer is a quantum well structure arranged to generate an optical gain across a broad wavelength spectrum.

4. The laser-diode device according to claim 1, wherein the periodic structure is a Bragg grating.

5. The laser-diode device according to claim 1, further comprising metallic layers respectively placed on the second cladding layer and under the first cladding layer, which are arranged to form an ohmic contact of the laser-diode.

6. The laser-diode device according to claim 1, wherein the terminal facets are coated with a passivation layer arranged to act as an anti-reflection layer, thus reducing the residual reflectivity at the semiconductor/air interface.

7. A method for obtaining a diode, the method comprising the progressive steps of:
   a) depositing a first cladding layer on a substrate;
   b) depositing an active layer on the first cladding layer;
   c) depositing a second cladding layer on the active layer;
   d) performing a first etching step through the second cladding layer, the active layer, and the first cladding layer and through only a portion of the substrate, so as to obtain a first and a second terminal facet arranged transversally to said second cladding layer, the active layer, the first cladding layer and a portion of the substrate; and
   e) performing a second etching step on the second cladding layer in proximity to one of the two terminal facets according to a predefined pattern, so as to obtain a periodic structure only within the second cladding layer, an optical cavity being bounded between the first terminal facet and the second terminal facet, integrated by the periodic structure,
   wherein the cladding layers are layers of semiconductor material including gallium arsenide, aluminium gallium arsenide, or combinations thereof, and the substrate comprises gallium arsenide.

8. The method for obtaining a diode according to claim 7, further comprising the step of:
   f) depositing metal layers placed respectively above the second cladding layer and under the substrate able to realize an ohmic contact of the diode.

9. A method for obtaining a diode, the method comprising the progressive steps of:
   a) depositing a first cladding layer on a substrate;
   b) depositing an active layer on the first cladding layer;
   c) depositing a second cladding layer on the active layer;
   d) performing a first etching step on the second cladding layer in proximity to one of two terminal facets according to a predefined pattern, so as to obtain a periodic structure placed only within the second cladding layer; and
   e) performing a second etching step through the second cladding layer, the active layer, and the first cladding layer and through only a portion of the substrate, so as to obtain a first and a second terminal facet arranged transversally to the second cladding layer, the active layer, the first cladding layer, and a portion of the substrate, an optical cavity being bounded between the first terminal facet and the second terminal facet, integrated by the periodic structure,
   wherein the cladding layers are layers of semiconductor material including gallium arsenide, aluminium gallium arsenide, or combinations thereof, and the substrate comprises gallium arsenide.

10. The method for obtaining a diode according to claim 9, further comprising the step of:
   f) depositing metal layers placed respectively above the second cladding layer and under the substrate able to realize an ohmic contact of the diode.

* * * * *